US007151666B2

(12) United States Patent
Song

(10) Patent No.: US 7,151,666 B2
(45) Date of Patent: Dec. 19, 2006

(54) SAFETY DETACHABLE BACK PANEL

(75) Inventor: Yew-Min Song, Taipei (TW)

(73) Assignee: Tatung Co., Ltd., Taipei (TW)

( * ) Notice: Subject to any disclaimer, the term of this patent is extended or adjusted under 35 U.S.C. 154(b) by 321 days.

(21) Appl. No.: 10/874,271

(22) Filed: Jun. 24, 2004

(65) Prior Publication Data
US 2005/0141192 A1 Jun. 30, 2005

(30) Foreign Application Priority Data
Dec. 29, 2003 (TW) .............................. 92222855 U

(51) Int. Cl.
H05K 7/20 (2006.01)
H05K 5/00 (2006.01)
F16B 41/00 (2006.01)

(52) U.S. Cl. ...................... 361/692; 361/683; 361/726; 70/58; 70/168; 70/232; 70/DIG. 57; 312/223.2

(58) Field of Classification Search ................ 361/683, 361/692, 724–727; 312/223.1–223.3; 248/222.13–222.14; 70/232, DIG. 56, DIG. 57, 58, 168
See application file for complete search history.

(56) References Cited

U.S. PATENT DOCUMENTS 4,401,247 A * 8/1983 Zoor ........................... 224/315
4,898,009 A * 2/1990 Lakoski et al. ................ 70/58
6,628,512 B1 * 9/2003 Searby et al. ............... 361/683
6,816,370 B1 * 11/2004 Searby et al. ............... 361/685
6,925,843 B1 * 8/2005 Pols Sandhu et al. .......... 70/86
6,927,968 B1 * 8/2005 Pols Sandhu et al. ...... 361/679

* cited by examiner

Primary Examiner—Michael Dalskovsky
Assistant Examiner—Robert J. Hoffberg
(74) Attorney, Agent, or Firm—Bacon & Thomas PLLC

(57) ABSTRACT

A safety detachable back panel mounted on the back surface of a server is disclosed, which comprises a panel body having two plain holes, retaining mechanisms adapted to secure the panel body to heat radiation vents in the back surface of the server, two second screw-mounting holes respectively aligned between the plain holes and two first screw-mounting holes in the back surface of the server, and a lock unit having a swivel sheet capable of being turned by a key, wherein the swivel hook blocks the passages between the plain holes and the second screw-mounting holes, so the screws mounted on the second screw-mounting holes cannot be unauthorizedly accessed by a tool. As a result, the safety detachable back panel can protect the internal storage data and the connectors of the external data transmission devices.

6 Claims, 3 Drawing Sheets

SAFETY DETACHABLE BACK PANEL

BACKGROUND OF THE INVENTION

1. Field of the Invention

The present invention relates to a safety detachable back panel and more particularly, to the safety detachable back panel at the back surface of a server.

2. Description of Related Art

The external data transmission devices of a conventional server, for example, a USB, DVD, FDD, etc. may be of a bad connection, or even of a complete connection failure to the server due to accidental collision.

Furthermore, due to a lack of a security mechanism, an unauthorized person may take importance storage devices away from the backside of the server, which may jeopardize the security of internal data.

Therefore, it is desirable to provide a safety detachable back panel that provides protection to the internal storage data of the server and the connectors of the external data transmission devices.

SUMMARY OF THE INVENTION

The present invention has been accomplished under the circumstances in view. It is therefore the main object of the present invention to provide a simple and inexpensive protective back panel for a server to protect the backside of the server and the external data transmission devices, preventing damage to the surface of component parts during an impact of the server or disclosure of internal storage data.

To achieve this and other objects of the present invention, the safety detachable back panel adapted to a server, which has a plurality of through holes and at least one first screw-mounting hole at a back surface thereof, comprises: a panel body having a plurality of heat radiation vents, at least one input/output port hole, and at least one plain hole corresponding to the at least one first screw-mounting hole of the server; at least two retaining mechanisms connected to the through holes of the server to enable the panel body to cover the back surface of the server; at least one second screw-mounting hole corresponding to the first screw-mounting hole of the back surface of the server capable of being inserted by at least one screw passing through the at least one plain hole of the panel body in order to affix of the panel body to the back surface of the server; and a lock unit having a swivel sheet capable of being turned by a key, wherein the lock unit is located between the at least one second screw-mounting hole and the at least one plain hole of the panel body in a locking status and is away from the passage between the at least one plain hole of the panel body and the at least one second screw-mounting hole in an unlocking status.

The safety detachable back panel preferably has two retaining mechanisms mounted around the border area of the panel body in order to firmly fix the safety detachable back panel to the server. The retaining mechanisms and the panel body can be integrally formed to simplify the manufacture of the safety detachable back panel. The structure of the retaining mechanisms is not limited, but preferably is a hook. The through holes connected to the retaining mechanisms are heat radiation vents. The at least one first screw-mounting hole of the server is also preferably a heat radiation vent or is a screw-fixed hole on the back surface of the server designed for another purpose, for example, for fixing the slayer hard disk. The quantity of the input/output port holes of the panel body depends on the required function of the user. The quantity of the at least one first screw-mounting hole of the server, the quantity of the at least one plain hole of the panel body, and the quantity of the at least one second screw-mounting hole is set to 1 or 2.

DETAILED DESCRIPTION OF THE PREFERRED EMBODIMENT

Figure 1:
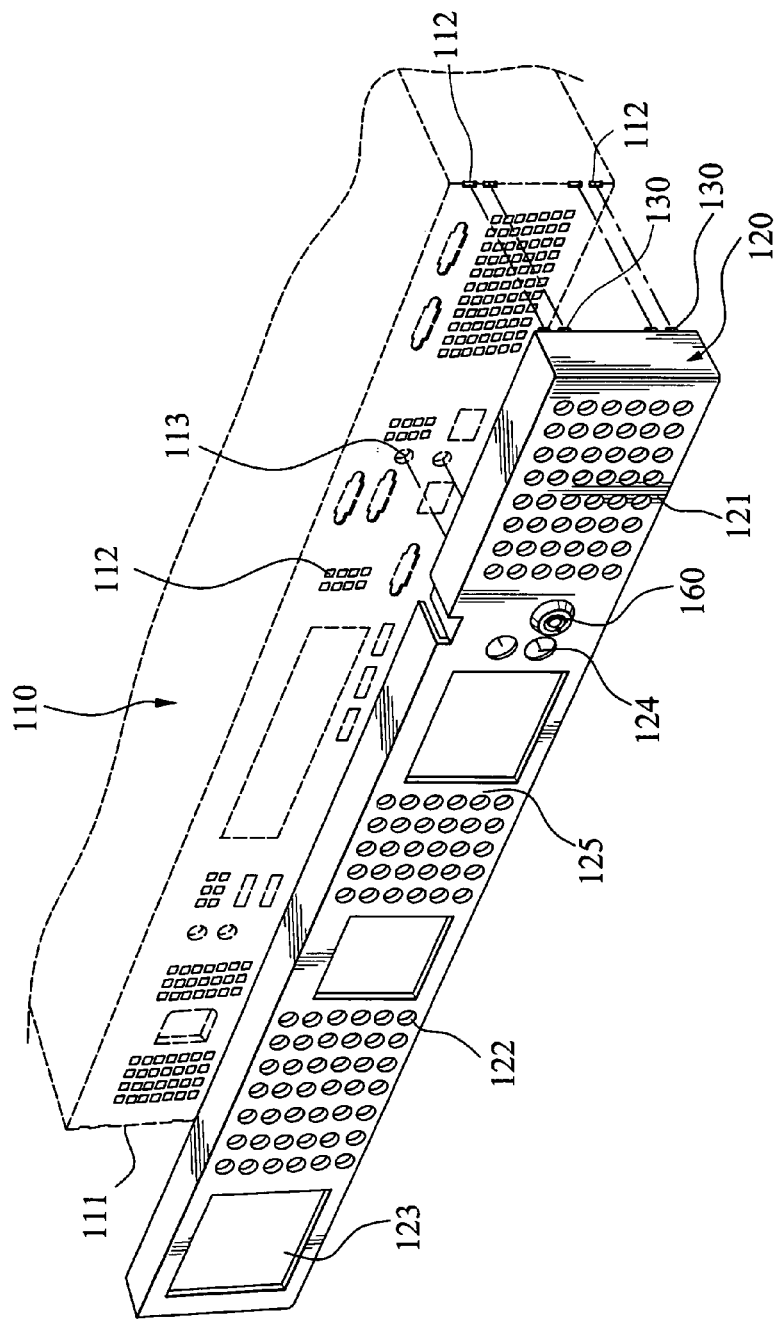
FIG. 1 is an exploded view of the preferred embodiment of the present invention.
Figure 2:
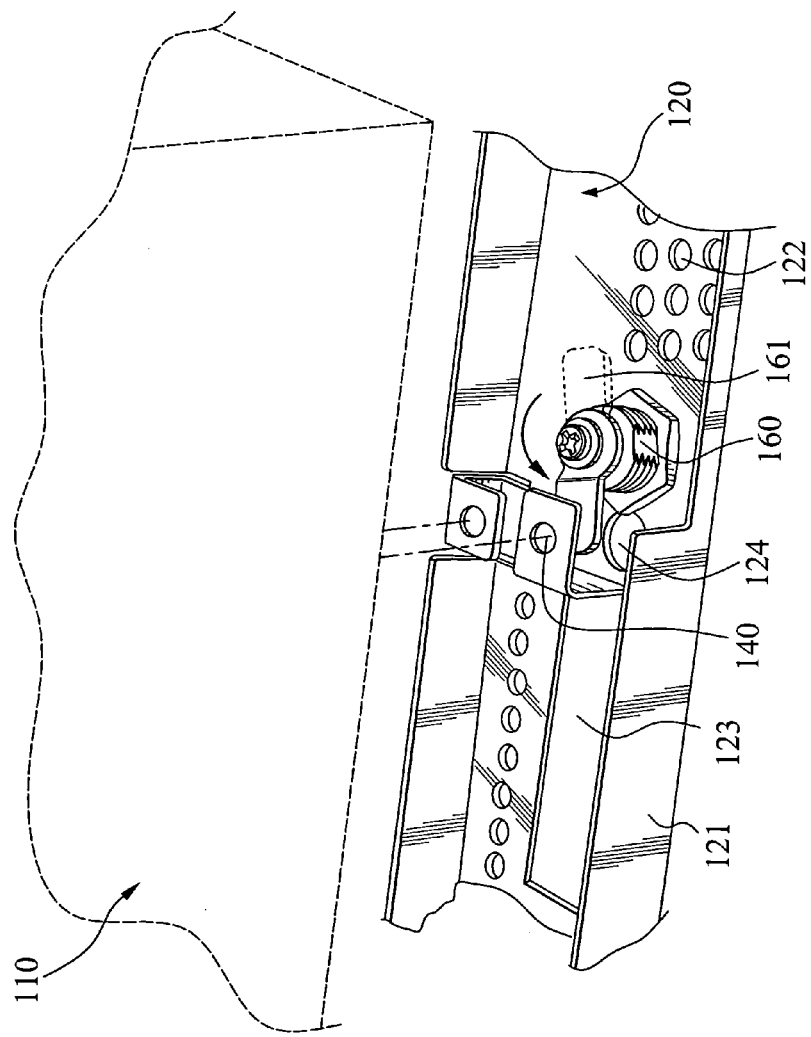
FIG. 2 is a schematic drawing showing the action of the lock unit of the safety detachable back panel according to the present invention.
Figure 3:
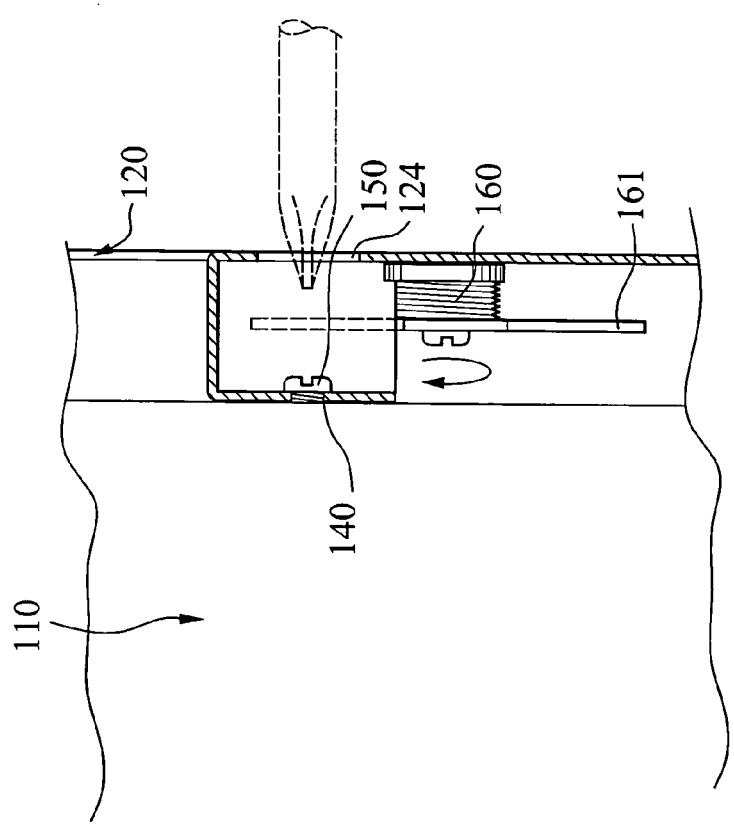
FIG. 3 is a cross-sectional view showing the action of the lock unit of the safety detachable back panel according to the present invention.

Referring to FIGS. 1~3, a safety detachable back panel 120 is installed on the back surface 111 of a server 110. The back surface 111 of the server 110 comprises a plurality of heat radiation vents 112 and two first screw-mounting holes 113. The safety detachable back panel 120 comprises a panel body 121, four retaining mechanisms 130, two second screw-mounting holes 140, and a lock unit 160. The panel body 121 comprises a plurality of heat radiation vents 122, three I/O port holes 123, and two plain holes 124 formed on the front surface 125 thereof. The plain holes 124 correspond to the first screw-mounting holes 113 in the back surface 111 of the server 110. The retaining mechanisms 130 are hooks formed integral with the panel body 121 around the border area thereof for hooking in the heat radiation vents 112 in the back surface 111 of the server 110 to have the panel body 121 cover the back surface 111 of the server 110. The two second screw-mounting holes 140 are formed integral with the panel body 121 and respectively attach to the first screw-mounting holes 113 in the back surface 111 of the server 110. Screws 150 are respectively inserted through the plain hole 124, and then mounted in the second screw-mounting holes 140, meanwhile the screws 150 are threaded into the first screw-mounting holes 113 to fix the panel body 121 to the back surface 111 of the server 110. The lock unit 160 is set in the panel body 121 of the safety back panel 120, having a swivel sheet 161 controlled by a key. When locked, the swivel sheet 161 of the lock unit 160 is set in between the plain hole 124 and the second screw-mounting hole 140, so a screwdriver cannot access the screws 150 fixed in the second screw-mounting holes 140.

During installation of the safety detachable back panel 120, the retaining mechanisms 130 are engaged in the heat radiation vents 112 in the back surface 111 of the server 110, and then two screws 150 are respectively inserted through the plain holes 124 and then fastened to the second screw-mounting holes 140 and the first screw-mounting holes 113 to fix the panel body 121 to the back surface 111 of the server 110, and then the key is used to turn the swivel sheet 161 to the locking position where the swivel sheet 161 conceals the screws 150.

As indicated above, the inexpensive safety detachable back panel is easy to install. When installed in the back surface of the server, the safety detachable back panel gives a protection to the backside of the server, preventing disconnection of the connectors of external data transmission devices from the back surface of the server.

Although the present invention has been explained in relation to its preferred embodiment, it is to be understood that many other possible modifications and variations can be made without departing from the spirit and scope of the invention as hereinafter claimed.

What is claimed is:

1. A safety detachable back panel adapted to a server, which has a plurality of through holes and at least one first screw-mounting hole at a back surface thereof, comprising:
   a panel body having a plurality of first heat radiation vents, at least one input/output port hole, and at least one plain hole corresponding to the at least one first screw-mounting hole of the server;
   at least two retaining mechanisms selectably connected to the through holes of the server whereby the panel body covers the back surface of the server;
   at least one second screw-mounting hole corresponding to the first screw-mounting hole of the back surface of the server capable of being inserted by at least one screw extended through the at least one plain hole of the panel body in order to affix of the panel body to the back surface of the server; and
   a lock unit having a swivel sheet capable of being turned by a key, wherein the swivel sheet is located between the at least one second screw-mounting hole and the at least one plain hole of the panel body in a locking status and is away from the passage between the at least one plain hole of the panel body and the at least one second screw-mounting hole in an unlocking status.

2. The safety detachable back panel as claimed in claim 1, wherein the at least two retaining mechanisms are formed around the border area of the panel body and are integrated with the panel body.

3. The safety detachable back panel as claimed in claim 1, wherein the at least two retaining mechanisms are hooks, which are selectably connected to the through holes of the server.

4. The safety detachable back panel as claimed in claim 3, wherein the through holes in the back surface of the server are second heat radiation vents.

5. The safety detachable back panel as claimed in claim 1, wherein the at least one first screw-mounting hole of the server each is a third heat radiation vent.

6. The safety detachable back panel as claimed in claim 1, wherein the quantity of the at least one first screw-mounting hole of the server, the quantity of the at least one plain hole of the panel body, and the quantity of the at least one second screw-mounting hole are each two.

* * * * *